United States Patent
Yamaki et al.

(10) Patent No.: US 11,047,937 B2
(45) Date of Patent: Jun. 29, 2021

(54) RADIO FREQUENCY POWER SUPPLY AND MAGNETIC RESONANCE IMAGING APPARATUS

(71) Applicant: CANON MEDICAL SYSTEMS CORPORATION, Otawara (JP)

(72) Inventors: Hirofumi Yamaki, Nasushiobara (JP); Susumu Kawaguchi, Hachioji (JP); Mitsuyuki Murakami, Nasushiobara (JP); Hisanori Suzuki, Otawara (JP); Hajime Tanaka, Sakura (JP)

(73) Assignee: CANON MEDICAL SYSTEMS CORPORATION, Otawara (JP)

( * ) Notice: Subject to any disclaimer, the term of this patent is extended or adjusted under 35 U.S.C. 154(b) by 13 days.

(21) Appl. No.: 16/458,721

(22) Filed: Jul. 1, 2019

(65) Prior Publication Data
US 2020/0003853 A1    Jan. 2, 2020

(30) Foreign Application Priority Data
Jul. 2, 2018   (JP) .............................. JP2018-125775

(51) Int. Cl.
*G01R 33/36*   (2006.01)
(52) U.S. Cl.
CPC ................................ *G01R 33/3614* (2013.01)
(58) Field of Classification Search
CPC .................... G01R 33/3607; G01R 33/3614
See application file for complete search history.

(56) References Cited

U.S. PATENT DOCUMENTS

| 5,053,709 | A | * | 10/1991 | Mitomi | G01R 33/3614 324/307 |
| 5,424,646 | A | * | 6/1995 | Hoshino | G01R 33/3614 324/318 |
| 2007/0279058 | A1 | * | 12/2007 | Bulkes | G01R 33/3614 324/314 |
| 2008/0079488 | A1 | * | 4/2008 | Albrecht | H03F 1/0244 330/127 |
| 2010/0148874 | A1 | * | 6/2010 | Thuringer | G01R 33/3614 330/279 |
| 2010/0308819 | A1 | * | 12/2010 | Umeda | G01R 33/3607 324/307 |
| 2015/0028870 | A1 | * | 1/2015 | Chen | G01R 33/365 324/309 |
| 2017/0261573 | A1 | | 9/2017 | Nakamura et al. | |
| 2017/0356972 | A1 | * | 12/2017 | Wheaton | G01R 33/4822 |
| 2017/0359034 | A1 | * | 12/2017 | Hussein | H03F 3/245 |
| 2018/0238978 | A1 | * | 8/2018 | McNulty | G01R 33/3806 |

FOREIGN PATENT DOCUMENTS

| JP | 2001-274632 | 10/2001 |
| JP | 2017-158883 | 9/2017 |

* cited by examiner

*Primary Examiner* — Steven L Yeninas
(74) *Attorney, Agent, or Firm* — Oblon, McClelland, Maier & Neustadt, L.L.P.

(57) ABSTRACT

A radio frequency power supply according to an embodiment is a radio frequency power supply that amplifies an input signal including application timing of a radio frequency magnetic field and waveform information and that supplies the amplified input signal to a radio frequency coil. The radio frequency power supply includes an amplifier and a controlling unit. The amplifier amplifies the input signal and to output an amplified signal. The controlling circuity varies power supply voltage used by the amplifier for the amplification of the input signal, in accordance with the input signal.

12 Claims, 5 Drawing Sheets

BACKGROUND ART

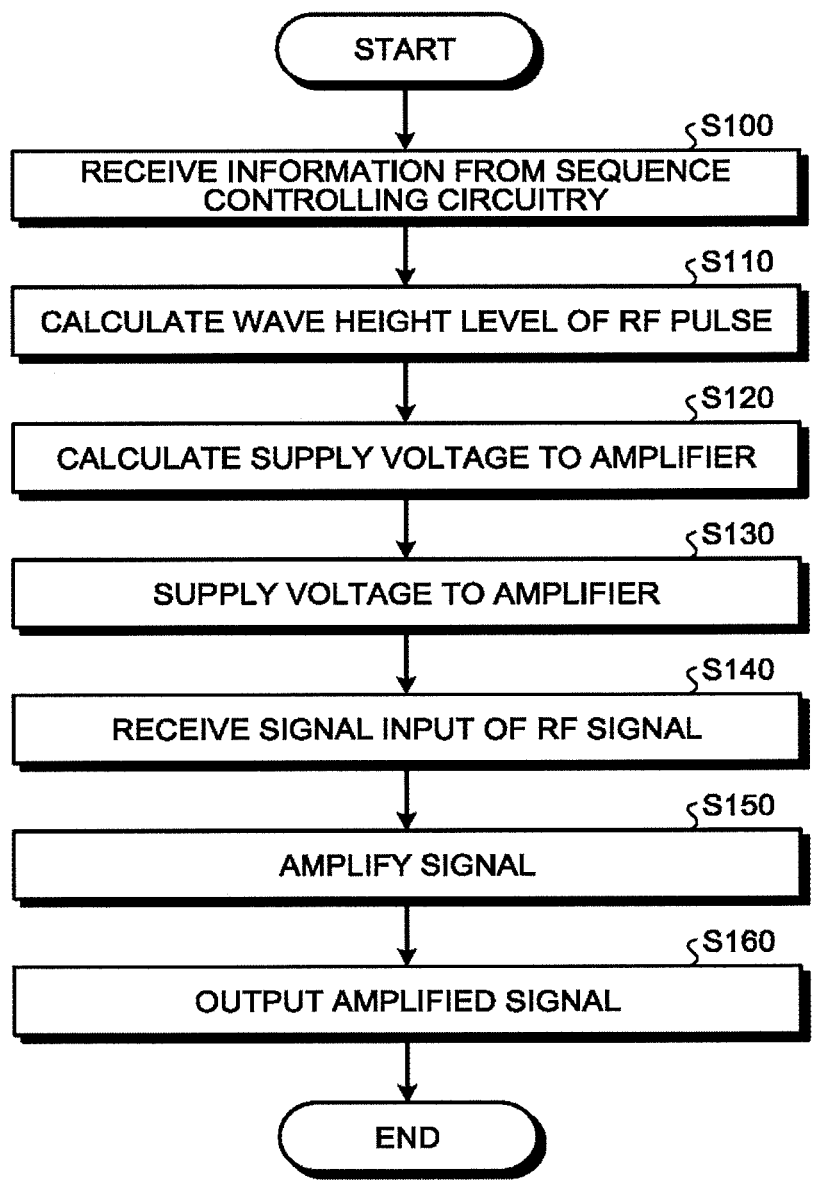

RADIO FREQUENCY POWER SUPPLY AND MAGNETIC RESONANCE IMAGING APPARATUS

CROSS-REFERENCE TO RELATED APPLICATIONS

This application is based upon and claims the benefit of priority from Japanese Patent Application No. 2018-125775, filed on Jul. 2, 2018; the entire contents of which are incorporated herein by reference.

FIELD

Embodiments described herein relate generally to a radio frequency power supply and a magnetic resonance imaging apparatus.

BACKGROUND

In a Radio Frequency (RF) amplifier (a radio frequency power supply) of a magnetic resonance imaging apparatus, a Field Effect Transistor (FET) may be used in an amplifying circuit (an amplifier) in some situations. In those situations, because the amplifying circuit is typically used in Class AB, the circuit is adjusted so as to exhibit excellent power efficiency near the rated output power.

However, the power efficiency of the radio frequency power supply may become low in same situations when the level of an output signal is significantly lower than the rated output level.

BRIEF DESCRIPTION OF THE DRAWINGS

FIG. 6 is drawing illustrating an example of a process performed by the radio frequency power supply according to the present embodiment; and FIG. 7 is a flowchart illustrating an example of a process performed by the radio frequency power supply according to the present embodiment.

DETAILED DESCRIPTION

A radio frequency power supply according to an embodiment is a radio frequency power supply that amplifies an input signal including application timing of a radio frequency magnetic field and waveform information and that supplies the amplified input signal to a radio frequency coil. The radio frequency power supply includes an amplifier and controlling circuitry. The amplifier is configured to amplify the input signal and to output an amplified signal. The controlling circuitry is configured to vary power supply voltage used by the amplifier for the amplification of the input signal, in accordance with the input signal.

EMBODIMENTS

Figure 1:
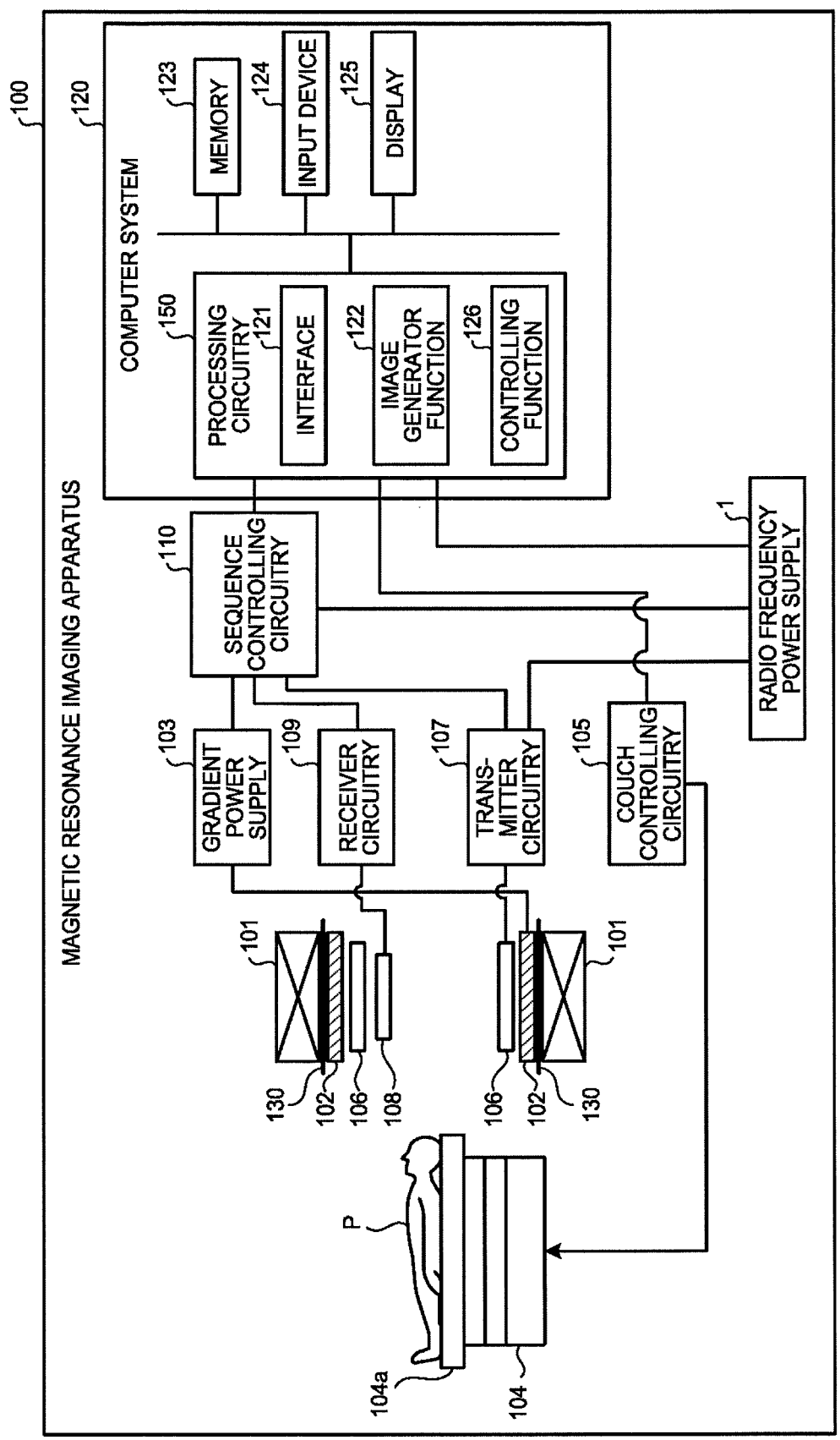
FIG. 1 is a diagram illustrating an example of a magnetic resonance imaging apparatus according to an embodiment.

An overall configuration of a magnetic resonance imaging apparatus according to a first embodiment will be explained, with reference to FIG. 1. FIG. 1 is a block diagram of a magnetic resonance imaging apparatus 100 according to the first embodiment.

As illustrated in FIG. 1, the magnetic resonance imaging apparatus 100 includes a static magnetic field magnet 101, a gradient coil 102, a gradient power supply 103, a couch 104, couch controlling circuitry 105, a transmitter coil 106, transmitter circuitry 107, a receiver coil 108, receiver circuitry 109, sequence controlling circuitry 110, a computer system 120, and a radio frequency power supply 1. An examined subject (hereinafter, "patient") P (e.g., a human body) is not included in the magnetic resonance imaging apparatus 100.

The static magnetic field magnet 101 is a magnet formed to have a hollow and circular cylindrical shape and is configured to generate a uniform static magnetic field in the space inside thereof. For example, the static magnetic field magnet 101 is a permanent magnet, a superconductive magnet, or the like.

The gradient coil 102 is a coil formed to have a hollow and circular cylindrical shape and is arranged on the inside of the static magnetic field magnet 101. The gradient coil 102 is formed by combining together three coils corresponding to X-, Y-, and axes that are orthogonal to one another. The three coils are figured to individually receive an electric current from the gradient power supply 103 and to generate gradient magnetic fields of which the magnetic field intensities vary along the X-, Y-, and axes. The Z-axis direction is the same as the direction of the static magnetic field. The Y-axis direction is the vertical direction. The X-axis direction is the direction perpendicular to the Z-axis and the Y-axis.

The gradient magnetic fields generated along the X-, Y-, and Z-axes by the gradient coil 102 form, for example, a slice-selecting gradient magnetic field Gs, a phase-encoding gradient magnetic field Ge, and a read-out gradient magnetic field Gr. The slice-selecting gradient magnetic field Gs is used for arbitrarily determining an image taking cross-sectional plane. The phase-encoding gradient magnetic field Ge is used for varying the phase of a Magnetic Resonance (MR) signal in accordance with a spatial position. The read-out gradient magnetic field Gr is used for varying the frequency of the MR signal in accordance with a spatial position.

The gradient power supply 103 is configured to supply the electric current to the gradient coil 102.

The couch 104 includes a couchtop 104a on which the patient P is placed. Under control of the couch controlling circuitry 105, the couchtop 104a is inserted to the inside of an image taking opening while the patient P is placed thereon. Normally, the couch 104 is installed in such a manner that the longitudinal direction thereof extends parallel to the central axis of the static magnetic field magnet 101. Under control of the computer system 120, the couch controlling circuitry 105 is configured to drive the couch 104 so as to move the couchtop 104a in longitudinal directions and up-and-down directions.

The transmitter coil 106 is arranged on the inside of the gradient coil 102 and is configured to generate a radio frequency magnetic field by receiving a supply of a Radio Frequency (RF) pulse from the transmitter circuitry 107. The transmitter circuitry 107 is configured to supply the transmitter coil 106 with the RF pulse corresponding to a Larmor frequency determined by the type of a target atomic nucleus and the intensity of the magnetic field.

The receiver coil 108 is arranged on the inside of the gradient coil 102 and is configured to receive an MR signal emitted from the patient P due to the influence of the radio frequency magnetic field. When having received the MR signal, the receiver coil 108 is configured to output the received MR signal to the receiver circuitry 109. For example, the receiver coil 108 is a coil array including one or more (typically two or more) coil elements.

The receiver circuitry 109 is configured to generate MR data on the basis of the MR signal output from the receiver coil 108. More specifically, the receiver circuitry 109 is configured to perform various types of signal processing processes such as a pre-amplifying process, an intermediate frequency conversion, a phase detection, a low-frequency amplifying process, a filtering process and/or the like on the MR signal output from the receiver coil 108 and to subsequently perform an analog/digital conversion on the data resulting from any of the various types of signal processing processes. As a result, the receiver circuitry 109 generates the MR data, which is digitalized complexed number data. The MR data generated by the receiver circuitry 109 may be referred to as raw data.

The receiver circuitry 109 is also configured to transmit the generated MR data to the sequence controlling circuitry 110. The receiver circuitry 109 may be provided on the side of a gantry device including the static magnetic field magnet 101, the gradient coil 102, and the like.

In the first embodiment, the MR signal output from the coil elements of the receiver coil 108 is output to the receiver circuitry 109 in units called channels or the like, by being distributed or combined as appropriate. Accordingly, in the processes performed by the receiver circuitry 109 and at stages thereafter, the MR data is handled for each of the channels.

As for the relationship between the total number of coil elements and the total number of channels, the total numbers may be equal. Alternatively, the total number of channels may be smaller than the total number of coil elements, or conversely, the total number of channels may be larger than the total number of coil elements. The timing with which the MR signal is distributed or combined is not limited to that in the example described above. It is sufficient when the MR signal or the MR data is distributed or combined in units of channels, prior to the processes performed by an image generator function 122 (explained later).

The sequence controlling circuitry 110 is configured to perform an image taking process on the patient P, by driving the gradient power supply 103, the transmitter circuitry 107, and the receiver circuitry 109, on the basis of information about an image taking sequence transmitted thereto from the computer system 120.

The image taking sequence denotes a pulse sequence corresponding to each of a plurality of protocols included in medical examinations to be performed by the magnets resonance imaging apparatus 100. The information about the image taking sequence defines: the intensity of a power supply to be supplied from the gradient power supply 103 to the gradient coil 102 and the timing with which the power supply is to be supplied; the intensity of the RF pulse to be transmitted from the transmitter circuitry 107 to the transmitter coil 106 and the timing with which the RF pulse is to be applied; the timing with which the MR signal is to be detected by the receiver circuitry 109, and the like.

When having received the MR data from the receiver circuitry 109, as a result of performing an image taking process on the patient P by driving the gradient power supply 103, the transmitter circuitry 107, the receiver circuitry 109, a shim coil power supply, and the like, the sequence controlling circuitry 110 transfers the received MR data to the computer system 120. The sequence controlling circuitry 110 is an example of the controlling unit.

The computer system 120 is configured to exercise overall control of the magnetic resonance imaging apparatus 100, to acquire data, to generate images, and the like. The computer system 120 includes processing circuitry 150, a memory 123, an input device 124, and a display device 125. Further, the processing circuitry 150 includes an interface function 121, the image generator function 122, and a controlling function 126.

Processing functions performed by the interface function 1, the image generator function 122, and the controlling function 126 are stored in the memory 123 in the form of computer-executable programs. The processing circuitry 150 is a processor configured to realize the functions corresponding to the programs, by reading and executing the programs from the memory 123. In other words, the processing circuitry 150 that has read the programs has the functions illustrated within the processing circuitry 150 in FIG. 1. With reference to FIG. 1, the example was explained in which the single processing circuitry (i.e., the processing circuitry 150) realizes the processing functions implemented by the interface function 121, the image generator function 122, and the controlling function 126; however, another arrangement is also acceptable in which the processing circuitry 150 is structured by combining together a plurality of independent processors, so that the functions are realized as a result of the processors executing the programs.

In other words, each of the functions described above may be configured as a program, so that the single processing circuit executes the programs or so that each of the specific functions is installed in a dedicated independent program-executing circuit.

The term "processor" used in the above explanations denotes, for example, a Central Processing Unit (CPU), a Graphics Processing Unit (GPU), or a circuit such as an Application Specific integrated Circuit (ASIC) or a programmable logic device (e.g., a Simple Programmable Logic Device [SPLD], a Complex Programmable Logic Device [CPLD], or a Field Programmable Gate Array [FPGA]). The one or more processors realize the functions by reading and executing the programs saved in the memory 123. In this situation, instead of saving the programs in the memory 123, it is also acceptable to directly incorporate the programs in the circuits of the one or more processors. In that situation, the one or more processors realize the functions by reading and executing the programs incorporated in the circuits thereof. Similarly, the couch controlling circuitry 105, the transmitter circuitry 107, the receiver circuitry 109, the radio frequency power supply 1 (e.g., controlling circuitry 1*z*, an amplifier 1*d*, calculating circuitry 1*a*, adjusting circuitry 1*b*, a switching power supply 1*c* illustrated in FIG. 5) explained later, and the like are also structured by using one or more electronic circuits like the processors described above.

By employing the interface function 121, the processing circuitry 150 is configured to transmit the information about the image taking sequence to the sequence controlling circuitry 110 and to receive the MR data from the sequence controlling circuitry 110. Further, when having received the MR data via the interface function 121, the processing circuitry 150 is configured to store the received MR data into the memory 123.

By employing the image generator function 122, the processing circuitry 150 is configured to generate an image by using the MR data received via the interface function 121 or the data stored in the memory 123. The processing circuitry 150 is configured to transmit the image obtained by the image generator function 122 to the display device 125 or the memory 123, as necessary.

By employing the controlling function 126, the processing circuitry 150 is configured to exercise the overall control of the magnetic resonance imaging apparatus 100. For example, by employing the controlling function 126, the processing circuitry 150 generates the information about the image taking sequence on the basis of an image taking condition input from an operator via the input device 124 and further controls the image taking process by transmitting the generated information about the image taking sequence to the sequence controlling circuitry 110.

The memory 123 is configured to stores therein the MR data received by the processing circuitry 150 via the interface function 121, image data generated by the image generator function 122, and the like. For example, the memory 123 may be a semiconductor memory element such as a Random Access Memory (RAM), a flash memory, or the like, or a hard disk, an optical disk, or the like.

The input device 124 is configured to receive various types of instructions and inputs of information from the operator. For example, the input device 124 may be a pointing device such as a mouse or a trackball or may be an inputting device such as a keyboard.

Under control of the controlling function 126 included in the processing circuitry 150, the display device 125 is configured to display various types of information such as image data or the like. For example, the display device 125 is a displaying device such as a liquid crystal display monitor.

The radio frequency power supply 1 is a circuit connected to the computer system 120, the sequence controlling circuitry 110, the transmitter circuitry 107, and the like and is configured to generate the RF pulse on the basis of an instruction received from the computer system 120 and the information about the sequence received from the sequence controlling circuitry 110 and to transmit the generated RF pulse to the transmitter circuitry 107. Details of the radio frequency power supply 1 will be explained later with reference to FIGS. 5 and 6.

Figure 2:
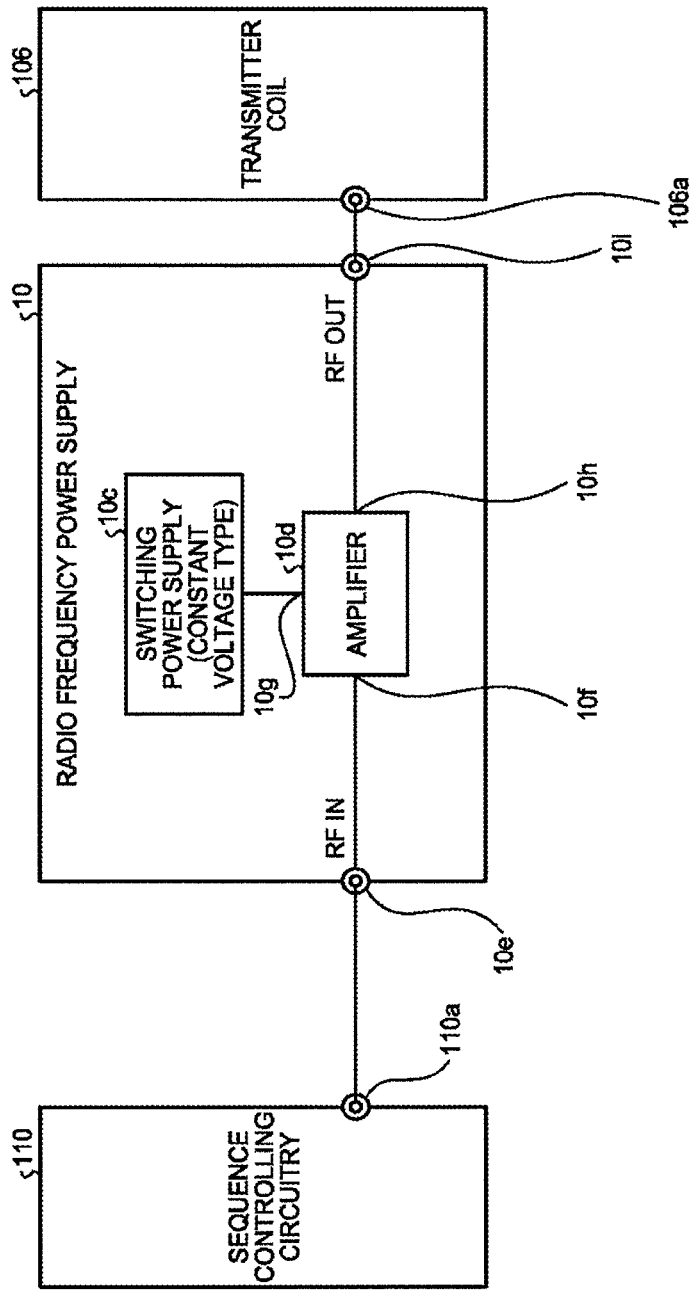
FIG. 2 is a diagram illustrating an example of a radio frequency power supply according to a comparison example.

Next, a background of the present embodiment will be explained, with reference to FIGS. 2 and 3. FIG. 2 is a drawing illustrating an example of a radio frequency power supply in a comparison example.

A radio frequency power supply 10 (an RF amplifier) in the comparison example includes: a switching power supply 10c that is of a constant voltage type and is configured to supply drain voltage Vdd to an input terminal 10g of an amplifier 10d by receiving a supply from an alternating-current power supply; and the amplifier 10d configured, while the drain voltage Vdd is being supplied thereto, to amplify an RF signal input thereto from an input terminal 10f and to output the amplified RF signal to an output terminal 10h. The amplifier 10d is structured by using a push-pull type amplifier employing Field Effect Transistors (FETs), for example, and is typically used in Class AB. An input terminal 10e of the radio frequency power supply 10 is connected to an output terminal 110a of the sequence controlling circuitry 110, so that the radio frequency power supply 10 obtains, via the input terminal 10e, an input signal before being amplified by the amplifier 10d, from the sequence controlling circuitry 110. An output terminal 10i of the radio frequency power supply 10 is connected to an input terminal 106a of the transmitter coil 106, so that the radio frequency power supply 10 outputs an amplified signal resulting from a signal amplification performed by the amplifier 10d, to the transmitter coil 106 via the output terminal 10i.

However, in the comparison example, when the FETs are employed by the amplifier 10d for the amplification, for example, the output impedance of the FETs varies depending on the electric power output to the output terminal 10h. Further, because the amplifier 10d usually performs the amplification in Class AB, the entire circuitry is designed so as to exhibit excellent power efficiency near the rated output. For this reason, regardless of the magnitude of the input signal input to the input terminal 10f of the amplifier 10d, the drain voltage Vdd at a constant level is supplied to the push-pull type amplifying circuit of the amplifier 10d, for example. Accordingly, from the viewpoint of power efficiency, when the output is significantly lower than the rated output, the power efficiency becomes low because the supplied drain voltage Vdd is excessive. For example, in a pulse sequence implementing a Chemical Exchange Saturation Transfer (CEST) scheme, a Continuous Arterial Spin Labeling (CASL) scheme, or the like, an RF pulse having a relatively long application time period is applied. Accordingly, because the load on the RF amplifier is relatively large, it is desirable to have high power efficiency. Further, improving the power efficiency also leads to inhibiting heat generation of the radio frequency power supply 10 itself. For this reason also, it is desirable to improve the power efficiency.

Figure 3:
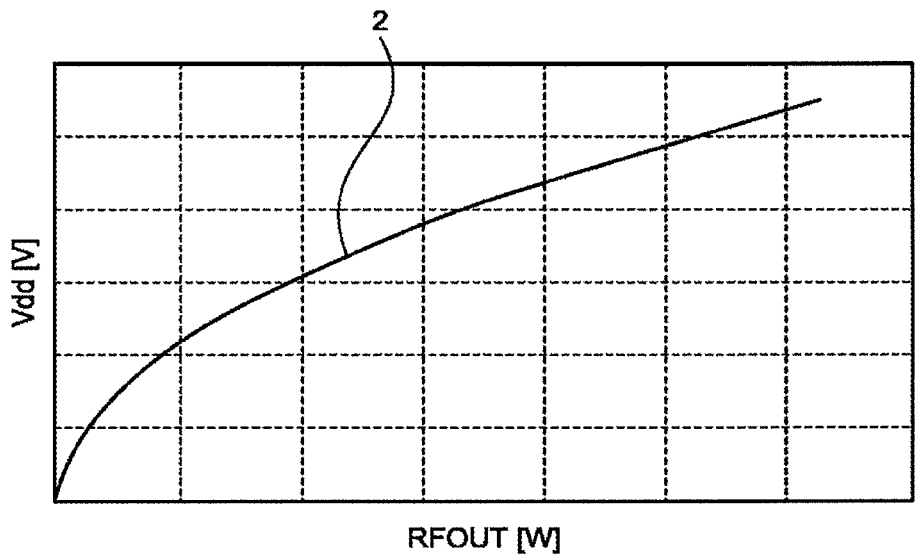
FIG. 3 is a chart for explaining a background of the present embodiment.

FIG. 3 is a chart for explaining the background of the present embodiment. A graph 2 indicates a relationship between power levels RFOUT output to the output terminal 10i of the radio frequency power supply 10 and levels of the drain voltage Vdd supplied to the input terminal 10g of the amplifier 10d. As observed also from the graph 2, the value of RFOUT per unit drain voltage Vdd (RFOUT/Vdd) is relatively large when the output power level RFOUT is large and decreases as the value of RFOUT decreases. Accordingly, the power efficiency decreases, as the output power level RFOUT decreases.

Figure 4:
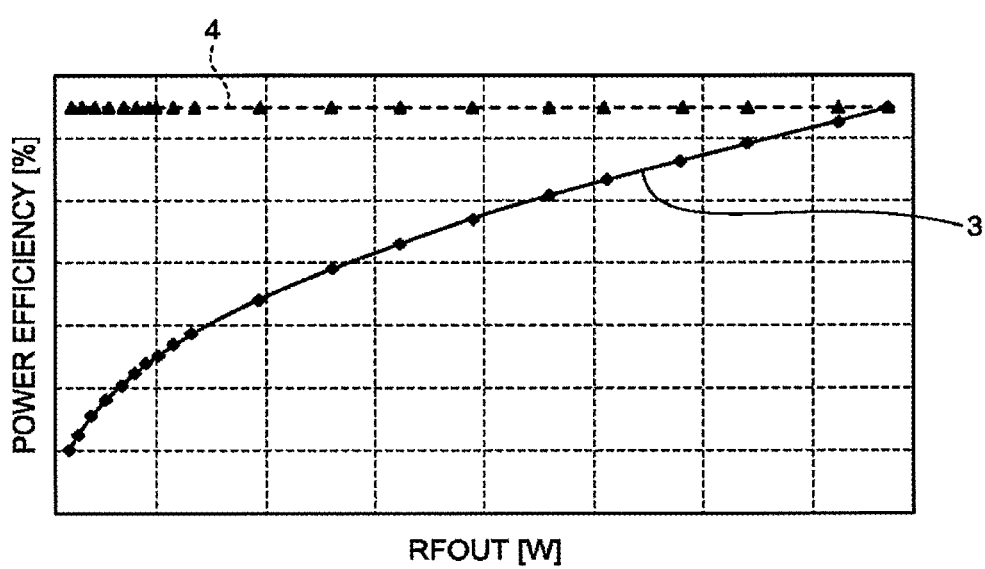
FIG. 4 is another chart for explaining the background of the present embodiment.

FIG. 4 is another chart for explaining the background of the present embodiment. A graph 3 indicates a relationship between the power levels RFOUT output to the output terminal 10i of the radio frequency power supply 10 and levels of power efficiency in the radio frequency power supply 10 in the comparison example. As observed also from the graph 3, in the comparison example, the power efficiency decreases in the region where the power level RECUT decreases. In contrast, as indicated by a graph 4, for example, when a configuration is adopted where the power efficiency does not decrease even when the power level RFOUT decreases, the power efficiency is not degraded even in the region away from the rated power level.

Figure 5:
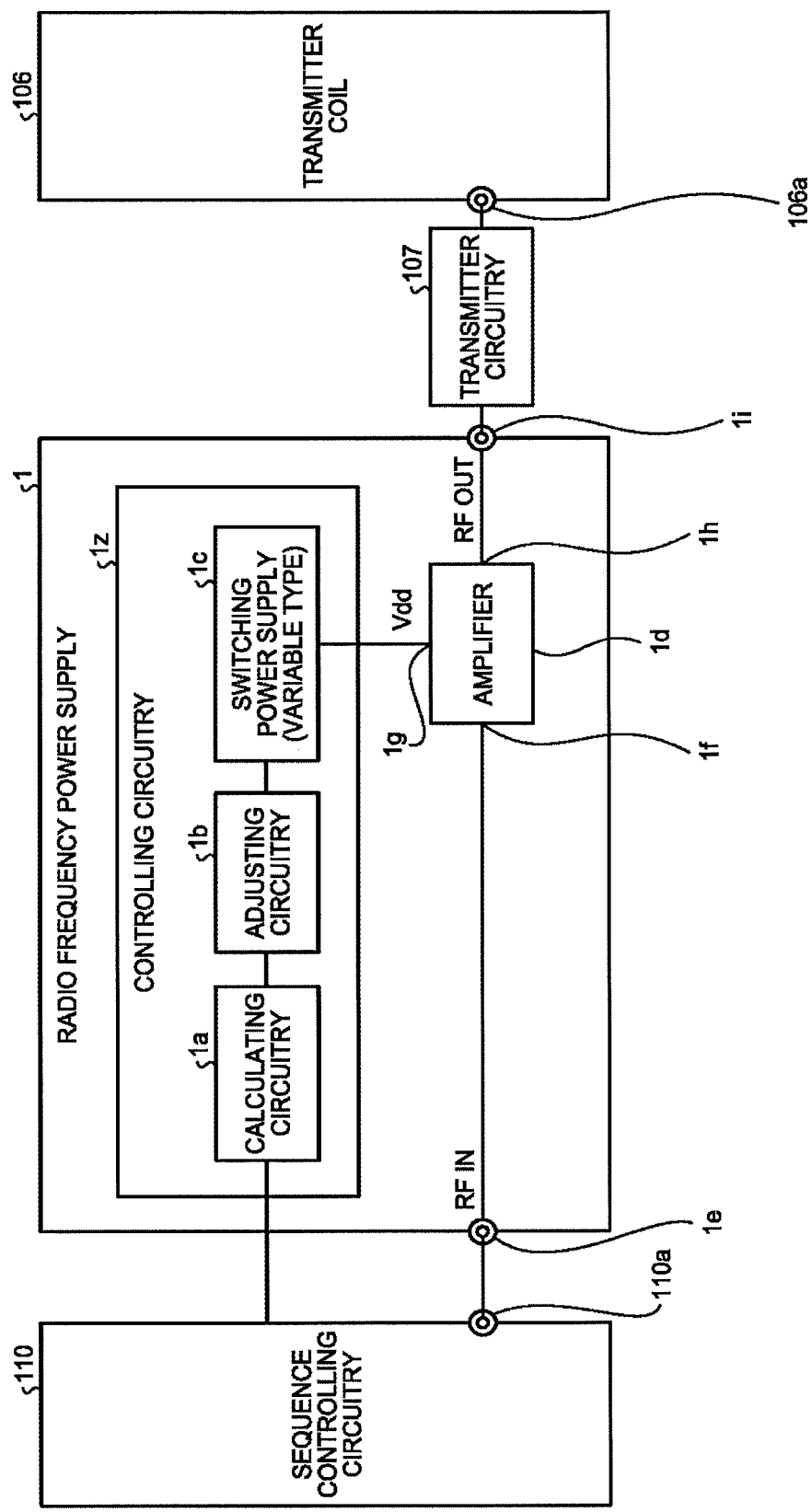
FIG. 5 is a drawing illustrating an example of a radio frequency power supply according to the present embodiment.

Configurations of the radio frequency power supply 1 and the magnetic resonance imaging apparatus 100 according to the present embodiment will be explained, with reference to FIG. 5. FIG. 5 is a drawing illustrating an example of the radio frequency power supply according to the present embodiment.

As illustrated in FIG. 5, the radio frequency power supply 1 according to the present embodiment includes the amplifier 1d and the controlling circuitry 1z. As explained above, the radio frequency power supply 1 is connected to the computer system 120, the sequence controlling circuitry 110, the transmitter circuitry 107, and the like and is configured to generate the RF pulse on the basis of an instruction received from the computer system 120 and the information about the sequence received from the sequence controlling circuitry 110 and to transmit the generated RF pulse to the transmitter coil 106 via the transmitter circuitry 107. For example, an input terminal 1e of the radio frequency power supply 1 is connected to the output terminal 110a of the sequence controlling circuitry 110, so that the radio frequency power supply 1 obtains an input signal including application timing of the radio frequency magnetic field and waveform information from the sequence controlling circuitry 110. Further, an output terminal 1i of the radio frequency power supply 1 is connected to the input terminal 106a of the transmitter coil 106 via the transmitter circuitry 107, so that the radio frequency power supply 1 outputs an amplified signal, which is the input signal amplified by the amplifier 1d, to the transmitter coil 106 via the transmitter circuitry 107. A so-called RF amplifier is an example of the radio frequency power supply 1.

The amplifier 1d is configured by using an electronic circuit including an amplifying mechanism that employs an amplifying element of which a typical example is a transistor such as an FET, e.g., an electronic circuit including a push-pull type amplifying circuit employing FETs. The amplifier 1d is configured to output the amplified signal obtained by amplifying the input signal while a predetermined level of voltage is being applied thereto.

More specifically, while being controlled by the controlling circuitry 1z, the amplifier 1d is configured to amplify the input signal input to an input terminal 1f, while the predetermined level of voltage is being applied to an input terminal 1g of the amplifier 1d and to further output the amplified signal, which is the obtained signal, to an output terminal 1h. For example, when the amplifier 1d is configured by using an electronic circuit including a push-pull type amplifying circuit, the controlling circuitry 1z applies the drain voltage Vdd to the input terminal 1g. In this situation, the drain voltage Vdd dynamically varies during the execution of the pulse sequence. In other words, while the drain voltage Vdd dynamically being varied is applied from the controlling circuitry 1z to the input terminal 1g, the amplifier 1d amplifies the input signal input to the input terminal 1f and further outputs the amplified signal to the output terminal 1h.

In this situation, the gain of the amplifier 1d, i.e., the ratio of the magnitude of the amplified signal to the magnitude of the input signal, is substantially constant regardless of the value of the voltage applied by the controlling circuitry 1z. In other words, when the drain voltage Vdd exceeds a level of drain voltage required for the magnitude of the input signal, the amplifier 1d amplifies the input signal input to the input terminal 1f by using a constant amplification ratio and further outputs the amplified signal to the output terminal 1h.

In this situation, if the controlling circuitry 1z did not control the drain voltage Vdd applied to the input terminal 1g, when the input signal is small, the drain voltage Vdd would be excessively high in comparison to the level of drain voltage required for the magnitude of the input signal, which would degrade the power efficiency. In view of this background, the controlling circuitry 1z is configured to dynamically vary the power supply voltage used by the amplifier 1d for the amplification of the input signal, in accordance with the magnitude of the input signal, during the execution of the pulse sequence. For example, the controlling circuitry 1z is configured to vary the drain voltage Vdd used by the amplifier 1d for the amplification of the input signal in accordance with the magnitude of the input signal input to the input terminal 1f, in such a manner that the drain voltage Vdd applied to the input terminal 1g is not excessively high in comparison to the level of drain voltage required for the magnitude of the input signal input to the input terminal 1f. Because the controlling circuitry 1z dynamically varies the power supply voltage in this manner, during the execution of the pulse sequence, in accordance with the magnitude of the input signal, it is possible to realize a reduction of electric power consumption.

The controlling circuitry 1z is a circuit configured by using any of various types of electronic circuits, a processor, or the like and is configured to vary the power supply voltage used by the amplifier 1d for the amplification of the input signal, in accordance with the magnitude of the input signal. The controlling circuitry 1z includes the calculating circuitry 1a, the adjusting circuitry 1b, and the switching power supply 1c. As explained earlier, the term "processor" denotes, for example, a Central Processing Unit (CPU), a Graphics Processing Unit (GPU), or a circuit such as an Application Specific Integrated Circuit (ASIC) or a programmable logic device (e.g., a Simple Programmable Logic Device [SPLD], a Complex Programmable Logic Device [CPLD], or a Field Programmable Gate Array [FPGA]). The calculating circuitry is, the adjusting circuitry 1b, and the like may each be configured by using any of various types of electronic component parts or may be configured by using the processor described herein or the like.

Further, the controlling circuitry 1z or the calculating circuitry 1a, the adjusting circuitry 1b, and the like may realize the functions thereof by reading and executing programs saved in a memory (not illustrated). Further, instead of saving the programs in the memory, it is also acceptable to directly incorporate the programs in the circuits of one or more processors. Further, a single processing circuit may realize the functions of these circuits. Alternatively, these circuits may be structured by combining together a plurality of independent processors, so that the functions of these circuits are realized as a result of the processors executing the programs.

The controlling circuitry 1z is an example of the controlling unit (the power supply controlling unit).

The calculating circuitry 1a is configured by using an electronic circuit or a processor such as that described above and is configured to obtain various types of information from the sequence controlling circuitry 110 and to calculate, on the basis of the obtained information, the power supply voltage to be supplied to the input terminal 1g of the amplifier 1d so that the output intensity of the signal output to the transmitter coil 106 is equal to or higher than an output intensity required by the execution of the pulse sequence.

In this situation, the information obtained by the calculating circuitry 1a from the sequence controlling circuitry 110 is information including the application timing of the radio frequency magnetic field and the waveform information and may be, for example, information including information about wave height values of the radio frequency magnetic field to be applied at different points in times. In addition, as an arbitrary element, the information obtained by the calculating circuitry 1a from the sequence controlling circuitry 110 may include information about a pulse width or the like. In addition, the calculating circuitry 1a may further obtain, from the sequence controlling circuitry 110, the sequence name of the pulse sequence to be executed, as well as information indicating whether the pulse sequence to be executed is for performing a pre-scan or for performing an imaging scan to acquire an image to be output, and the like.

On the basis of the information obtained from the sequence controlling circuitry 110 in this manner, the calculating circuitry 1a is configured to calculate the level of the power supply voltage to be supplied to the input terminal 1g of the amplifier 1d.

According to a first method implemented by the calculating circuitry 1a to calculate the power supply voltage to be supplied to the input terminal 1g of the amplifier 1d, the calculating circuitry 1a calculates the level of the power supply voltage to be supplied to the input terminal 1g of the amplifier 1d on the basis of a relational expression between wave height values of the radio frequency magnetic field and the power supply voltage (supply voltage) to be supplied to the input terminal 1g of the amplifier 1d, on the basis of the application timing of the radio frequency magnetic field and the waveform information obtained from the sequence controlling circuitry 110. In other words, the controlling circuitry 1z varies the power supply voltage on the basis of the wave height values of the radio frequency magnetic field. For example, on the basis of the application timing of the radio frequency magnetic field and the waveform information obtained from the sequence controlling circuitry 110, the calculating circuitry 1a calculates a wave height value h (amplitude or voltage) of the radio frequency magnetic field to be input. In the following sections, an example will be explained in which, as the weight height value h of the radio frequency magnetic field to be input, a wave height value of the radio frequency magnetic field observed before being amplified by the amplifier 1d is used Subsequently, because the value of power supply voltage V to be supplied to the input terminal 1g of the amplifier 1d is substantially proportional to the square of the wave height value h of the radio frequency magnetic field to be input, the calculating circuitry 1a calculates the value of the power supply voltage V on the basis of the wave height value h of the radio frequency magnetic field, by using, for example, a relational expression $V=V_0 \times (h/h_0)^2$ where $h_0$ denotes the wave height value of the radio frequency magnetic field to be input when the output is the rated output, and $V_0$ denotes the power supply voltage to be supplied to the input terminal 1g of the amplifier 1d when the output is the rated output.

Further, according to a second method implemented by the calculating circuitry 1a to calculate the value of the power supply voltage to be supplied to the input terminal 1g of the amplifier 1d, the calculating circuitry 1a calculates the level of the power supply voltage to be supplied to the input terminal 1g of the amplifier 1d, by obtaining a table indicating a relationship between magnitudes (wave height values) of the input signal to be input to the input terminal 1f of the amplifier 1d and levels of the power supply voltage (the drain voltage Vdd). In other words, by obtaining the table indicating the relationship between the magnitudes of the input signal to be input to the input terminal 1f of the amplifier 1d and the levels of the power supply voltage, the controlling circuitry 1z varies the power supply voltage in accordance with the magnitude of the input signal. FIG. 6 is a drawing illustrating an example of a process performed by the radio frequency power supply according to the present embodiment. FIG. 6 illustrates an example of the above-mentioned table. The table in FIG. 6 is a table indicating pre-amplification wave height values h of the radio frequency magnetic field to be input to the input terminal 1f of the amplifier 1d and values of the drain voltage Vdd to be supplied to the input terminal 1g of the amplifier 1d. The table in FIG. 6 is an example of the table indicating the relationship between the magnitudes of the input signal to be input to the amplifier 1d and the levels of the power supply voltage to be applied to the amplifier 1d. For example, when the wave height value is "0.81 $h_0$", the value of the power supply voltage to be supplied is "0.65$V_0$". When the wave height value is "0.9 $h_0$", the value of the power supply voltage be supplied is "0.8$V_0$". When the wave height value is "1.0 $h_0$", the value of the power supply voltage to be supplied is "1.0$V_0$".

In this situation, the table is stored and saved, for example, either in a memory not illustrated) or in the memory 123 included in the computer system 120. The calculating circuitry 1a obtains the table stored either in the memory (not illustrated) or in the memory 123 included in the computer system 120 and further calculates the value of the power supply voltage to be supplied to the input terminal 1g of the amplifier 1d, on the basis of the obtained table and the wave height value of the radio frequency magnetic field calculated on the basis of the information obtained from the sequence controlling circuitry 110. For example, when the wave height value of the radio frequency magnetic field calculated on the basis of the information obtained from the sequence controlling circuitry 110 is "0.9 $h_0$", the calculating circuitry 1a calculates the value of the power supply voltage to be supplied as "0.8$V_0$". In another example, when the wave height value of the radio frequency magnetic field calculated on the basis of the information obtained from the sequence controlling circuitry 110 is "0.95 $h_0$", the calculating circuitry 1a calculates the value of the power supply voltage to be supplied as "$((0.95\ h_0-0.90\ h_0) \times 1.0V_0 + (1.0\ h_0-0.95\ h_0) \times 0.8V_0)/(1.0\ h_0-0.9\ h_0)=0.9V_0$" by performing a linear interpolation process between the table corresponding to a wave height value of "0.9 $h_0$" and the table corresponding to a wave height value of "1.0 $h_0$".

According to a third method implemented by the calculating circuitry 1a to calculate the value of the power supply voltage to be supplied to the input terminal 1g of the amplifier 1d, the calculating circuitry 1a calculates the level of the power supply voltage to be supplied to the input terminal 1g of the amplifier 1d, on the basis of a condition determined on the basis of data obtained by applying the radio frequency magnetic field to a patient. Accordingly, in addition to the magnitude of the input signal, the controlling circuitry 1z varies the power supply voltage to be applied to the amplifier 1d, further on the basis of the condition determined on the basis of the data obtained by applying the radio frequency magnetic field to the patient. In other words, because the level of the output of the radio frequency magnetic field to be applied in an executed pulse sequence slightly varies among patients, the sequence controlling circuitry 110 performs, in advance, a preliminary image taking process on a patient to be imaged, so that the calculating circuitry 1a calculates the value of the power supply voltage to be supplied to the input terminal 1g of the amplifier 1d, further on the basis of a result of the performed preliminary image taking process. In other words, the sequence controlling circuitry 110 performs the preliminary image taking process by applying the radio frequency magnetic field to the patient to acquire the data used for determining the power supply voltage to be applied. On the basis of the data acquired by the sequence controlling circuitry 110, the calculating circuitry 1a calculates the level of the power supply voltage to be supplied to the input terminal 1g of the amplifier 1d. In an example, on the basis of the data acquired by the sequence controlling circuitry 110, the calculating circuitry 1a calculates the thickness of the body of the patient and calculates a level of the power supply voltage to be supplied to the input terminal 1g of the amplifier 1d on the basis of the calculated body thickness of the patient. For example, when the calculated body thickness of the patient is large, because it is desirable to have a large output for the RF pulse, the calculating circuitry 1a arranges the value of the power supply voltage to be supplied to the input terminal 1g of the amplifier 1d to be a larger value compared to that in the situation where a calculated body thickness of a patient is small. In another example, the calculating circuitry 1a may perform a correcting process on the power supply voltage to be supplied to the input terminal 1g of the amplifier 1d that has been calculated on the basis of the wave height value h of the radio frequency magnetic field, on the basis of a result of the preliminary image taking process performed on the patient, so as to use the corrected value as the power supply voltage to be supplied to the input terminal 1g of the amplifier 1d.

Further, when calculating the value of the power supply voltage to be supplied to the input terminal 1g of the amplifier 1d, the calculating circuitry 1a may take into account the type of the pulse sequence to be executed. For example, when the pulse sequence to be executed by the sequence controlling circuitry 110 is based on a Chemical Exchange Saturation Transfer (CEST) scheme or a Continuous Arterial Spin Labeling (CASL) scheme, an RF pulse having a relatively longer application time period is applied. Accordingly, the load on the radio frequency power supply 1 is larger. For this reason, when the pulse sequence to be executed by the sequence controlling circuitry 110 is based on a CEST scheme or a CASL scheme, the calculating circuitry 1a arranges the value of the power supply voltage to be supplied to the input terminal 1g of the amplifier 1d to be a larger value compared to the situations where the pulse sequence to be executed by the sequence controlling circuitry 110 is other types of pulse sequences.

Next, the adjusting circuitry 1b and the switching power supply 1c will be explained.

Similarly to the calculating circuitry 1a, the adjusting circuitry 1b is configured by using any of various types of electronic circuits or a processor and is configured to obtain information from the calculating circuitry 1a and to adjust the voltage value of the switching power supply 1c. More specifically, the adjusting circuitry 1b is configured to obtain, from the calculating circuitry 1a, the value of the power supply voltage to be supplied to the input terminal 1g of the amplifier 1d and to adjust the voltage value to be input to the switching power supply 1c, so that the switching power supply 1c supplies the power supply voltage to the input terminal 1g of the amplifier 1d.

The switching power supply 1c is a power supply device configured to output a stable direct-current signal by receiving an input of an alternating-current signal. In one example, the switching power supply 1c includes: a rectification bridge that rectifies the alternating-current signal that has been input thereto; a capacitor provided on the primary side and used for smoothing; a switching element that generates an alternating current at a radio frequency by repeatedly switching on and off; a radio frequency transformer that transfers the alternating current generated by the switching element to the secondary side; and a rectification diode and a smoothing capacitor provided on the secondary side. The switching power supply 1c is configured to supply a desired level of direct-current voltage for the alternating-current signal input thereto. More specifically, the switching power supply 1c is configured to use, as an input, the alternating current having the voltage value obtained from the adjusting circuitry 1b and input to the switching power supply to, and is configured to supply the input terminal 1g with the power supply voltage having the value calculated by the calculating circuitry 1a to be supplied to the input terminal 1g of the amplifier 1d.

A flow in the process described above is presented in FIG. 7. FIG. 7 is a flowchart illustrating an example of the process performed by the radio frequency power supply according to the present embodiment.

First, the calculating circuitry 1a receives and obtains, from the sequence controlling circuitry 110, the information about the input signal including the application timing of the radio frequency magnetic field and the waveform information (step S100). The calculating circuitry 1a calculates the wave height level of the RF pulse on the basis of the information about the input signal obtained from the sequence controlling circuitry 110 at step S100 (step S110). In this situation, the information about the input signal obtained by the calculating circuitry 1a from the sequence controlling circuitry 110 is input from the sequence controlling circuitry 110 as either analog data or digital data. Subsequently, on the basis of the calculated wave height level of the RF pulse, the calculating circuitry 1a calculates supply voltage (the power supply voltage) to the input terminal 1g of the amplifier 1d, by using the power supply voltage calculating method described above (step S120). On the basis of the value of the power supply voltage calculated by the calculating circuitry 1a at step S120, the adjusting circuitry 1b controls the switching power supply 1c. On the basis of the control exercised by the adjusting circuitry 1b, the switching power supply 1c supplies the power supply voltage to the input terminal of the amplifier 1d (step S130). In this manner, the controlling circuitry 1z varies the power supply voltage used by the amplifier 1d for the amplification of the input signal input to the input terminal 1f, in accordance with the magnitude of the input signal, e.g., on the basis of the wave height value h of the radio frequency magnetic field.

Further, from the sequence controlling circuitry 110, the amplifier 1d receives a signal input of the input signal including the application timing of the radio frequency magnetic field and the waveform information, via the input terminal 1e (step 140). The input signal is input thereto from the sequence controlling circuitry 110 as either analog data or digital data.

While the power supply voltage determined at step S130 is being applied to the input terminal 1f, the amplifier 1d amplifies the input signal input to the input terminal 1e and outputs the amplified signal (step S150). Via the transmitter circuitry 107, the radio frequency power supply 1 outputs the signal amplified at step S150 to the transmitter coil (the radio frequency coil) 106, amplifies the input signal including the application timing of the radio frequency magnetic field and the waveform information, and supplies the amplified input signal to the RF coil (step S160).

As explained above, the magnetic resonance imaging apparatus 100 according to the present embodiment includes the sequence controlling circuitry 110, the amplifier 1d, and the controlling circuitry 1z (the power supply controlling unit). The sequence controlling circuitry 110 is configured to output the input signal including the application timing of the radio frequency magnetic field and the waveform information to the amplifier 1d. The amplifier 1d supplies the amplified signal obtained by amplifying the input signal input thereto from the sequence controlling circuitry 110, to the radio frequency coil (the transmitter coil 106). The controlling circuitry 1z varies the power supply voltage Vdd used by the amplifier 1d for the amplification of the input signal, in accordance with the magnitude of the input signal.

As explained above, by using the radio frequency power supply 1 and the magnetic resonance imaging apparatus 100 according to the present embodiment, it is possible to reduce the electric power consumption and to inhibit the heat generation because the electric power consumption is suppressed in the region away from the rated output.

Possible embodiments are not limited to the examples described above.

For instance, the example was explained in which the calculating circuitry 1a uses the wave height value of the radio frequency magnetic field before the amplification as the wave height value h of the radio frequency magnetic field. However, possible embodiments are not limited to this example. The calculating circuitry 1a may use a wave height value of the radio frequency magnetic field after the amplification, as the wave height value h of the radio frequency magnetic field.

Further, as for the configuration of the amplifier 1d, the example was explained in which the amplifier 1d is configured by using the push-pull type amplifying circuit employing the FETs; however, possible configurations of the amplifier 1d are not limited to configuration in the above example. The amplifier 1d may be configured by using an electronic circuit other than push-pull type amplifying circuits, such as, for example, a circuit that performs amplification by using a single FET. Alternatively, the amplifier 1d may be configured by using an electronic circuit that employs one or more amplifying elements different from the FETs.

In the embodiment, the information that the calculating circuitry 1a acquires from the sequence controlling circuitry 110 is not limited to the wave height value but may contain information of a pulse width of a radio frequency magnetic field prior to the modulation of the carrier waves. In such a case, the calculating circuitry 1a calculates, based on the relationship between a pulse width of a radio frequency magnetic field and a power supply voltage (supply voltage) that is to be supplied to the input terminal 1g of the amplifier 1d, the amount of the power supply voltage that is to be supplied to the input terminal 1g of the amplifier 1d. In other words, the controlling circuitry 1z varies the power supply voltage based on a pulse width of the radio frequency magnetic field.

Further, the power supply voltage which is varied by the controlling circuitry 1z according to the input signal that contains the information of application timings and waveforms may be varied continuously. Alternatively, the output level of the power supply voltage may be varied discretely and in a step-by-step manner.

Further, the example was explained in which the switching power supply 1c is used as the power supply; however, possible embodiments are not limited to this example. In the embodiments, it is acceptable to use a different type of power supply other than the switching power supply 1c.

According to at least one aspect of the embodiments described above, it is possible to enhance the power efficiency.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A radio frequency power supply configured to amplify an input signal including application timing of a radio frequency magnetic field and waveform information and to supply the amplified input signal to a radio frequency coil, the radio frequency power supply comprising:
   an amplifier configured to amplify the input signal and to output an amplified signal; and
   controlling circuitry configured to vary power supply voltage used by the amplifier for the amplification of the input signal, in accordance with the input signal, wherein the controlling circuitry varies the power supply voltage based on (1) a power supply voltage to be supplied to an input terminal of the amplifier when an output is a rated output, (2) a wave height value of the radio frequency magnetic field, and (3) a wave height value of the radio frequency magnetic field to be input when the output is the rated output.

2. The radio frequency power supply according to claim 1, wherein the controlling circuitry varies the power supply voltage, further on a basis of a condition determined on a basis of data obtained by applying the radio frequency magnetic field to a patient.

3. The radio frequency power supply according to claim 1, wherein the controlling circuitry dynamically varies the power supply voltage during execution of a pulse sequence.

4. The radio frequency power supply according to claim 1, wherein the controlling circuitry varies the power supply voltage in accordance with a magnitude of the input signal, by obtaining a table indicating a relationship between magnitudes of the input signal and levels of the power supply voltage.

5. The radio frequency power supply according to claim 1, wherein the controlling circuitry varies the power supply voltage on a basis of a pulse width of the radio frequency magnetic field.

6. The radio frequency power supply according to claim 1, wherein the input signal is input from sequence controlling circuitry as either analog data or digital data.

7. A magnetic resonance imaging apparatus comprising:
   sequence controlling circuitry configured to output, to an amplifier, an input signal including application timing of a radio frequency magnetic field and waveform information;
   the amplifier configured to supply a radio frequency coil with an amplified signal obtained by amplifying the input signal input from the sequence controlling circuitry; and
   power supply controlling circuitry configured to vary power supply voltage used by the amplifier for the amplification of the input signal, in accordance with the input signal, wherein the power supply controlling circuitry varies the power supply voltage based on (1) a power supply voltage to be supplied to an input terminal of the amplifier when an output is a rated output, (2) a wave height value of the radio frequency magnetic field, and (3) a wave height value of the radio frequency magnetic field to be input when the output is the rated output.

8. The magnetic resonance imaging apparatus according to claim 7, wherein the power supply controlling unit varies the power supply voltage on a basis of a condition determined on a basis of data obtained by applying the radio frequency magnetic field to a patient.

9. The magnetic resonance imaging apparatus according to claim 7, wherein the controlling circuitry dynamically varies the power supply voltage during execution of a pulse sequence.

10. The magnetic resonance imaging apparatus according to claim 7, wherein the controlling circuitry varies the power supply voltage in accordance with a magnitude of the input signal, by obtaining a table indicating a relationship between magnitudes of the input signal and levels of the power supply voltage.

11. The magnetic resonance imaging apparatus according to claim 7, wherein the controlling circuitry varies the power supply voltage on a basis of a pulse width of the radio frequency magnetic field.

12. The magnetic resonance imaging apparatus according to claim 7, wherein the input signal is input from sequence controlling circuitry as either analog data or digital data.

\* \* \* \* \*